United States Patent
Yamazaki et al.

(10) Patent No.: US 8,802,185 B2
(45) Date of Patent: Aug. 12, 2014

(54) DEPOSITION METHOD AND METHOD FOR MANUFACTURING LIGHT-EMITTING DEVICE

(75) Inventors: Shunpei Yamazaki, Tokyo (JP); Koichiro Tanaka, Kanagawa (JP); Hisao Ikeda, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 409 days.

(21) Appl. No.: 12/472,562

(22) Filed: May 27, 2009

(65) Prior Publication Data
US 2009/0297694 A1 Dec. 3, 2009

(30) Foreign Application Priority Data
May 29, 2008 (JP) ................................. 2008-141521

(51) Int. Cl.
*B05D 5/12* (2006.01)
(52) U.S. Cl.
USPC ............. 427/66; 427/146; 427/595; 427/596; 438/29; 438/22; 438/587
(58) Field of Classification Search
None
See application file for complete search history.

(56) References Cited

U.S. PATENT DOCUMENTS

| | | | |
|---|---|---|---|
| 5,421,895 A * | 6/1995 | Tsubouchi et al. | 118/726 |
| 5,714,195 A | 2/1998 | Shiba et al. | |
| 5,851,709 A * | 12/1998 | Grande et al. | 430/7 |
| 6,220,912 B1 | 4/2001 | Shigeoka et al. | |
| 6,440,877 B1 | 8/2002 | Yamazaki et al. | |
| 6,699,597 B2 | 3/2004 | Bellmann et al. | |
| 6,776,880 B1 | 8/2004 | Yamazaki | |
| 7,115,434 B2 | 10/2006 | Yamazaki et al. | |
| 7,223,514 B2 | 5/2007 | Kang et al. | |
| 7,265,489 B2 | 9/2007 | Yamasaki et al. | |
| 7,288,420 B1 | 10/2007 | Yamazaki et al. | |
| 7,378,711 B2 | 5/2008 | Suh et al. | |
| 7,445,825 B2 | 11/2008 | Wolk et al. | |
| 7,473,928 B1 | 1/2009 | Yamazaki et al. | |
| 7,494,837 B2 | 2/2009 | Yamazaki et al. | |
| 7,521,722 B2 | 4/2009 | Yamazaki et al. | |
| 7,548,023 B2 | 6/2009 | Yamazaki et al. | |
| 7,648,944 B2 | 1/2010 | Matsuo et al. | |
| 7,674,749 B2 | 3/2010 | Kang et al. | |

(Continued)

FOREIGN PATENT DOCUMENTS

| | | |
|---|---|---|
| EP | 0 851 714 A2 | 7/1998 |
| EP | 1 003 354 A1 | 5/2000 |

(Continued)

*Primary Examiner* — Monica Huson
(74) *Attorney, Agent, or Firm* — Husch Blackwell LLP

(57) ABSTRACT

An object is to provide a deposition method for smoothly obtaining desired pattern shapes of material layers and a method for manufacturing a light-emitting device while throughput is improved when a plurality of different material layers is stacked on a substrate. A material layer is selectively formed in advance in a position overlapped with a light absorption layer over a first substrate by pump feeding. Three kinds of light-emitting layers are deposited on one deposition substrate. This first substrate and a second substrate that is to be a deposition target substrate are arranged to face each other, and the light absorption layer is heated by being irradiated with light, whereby a film is deposited on the second substrate. Three kinds of light-emitting layers can be deposited with positional accuracy by performing only one position alignment before light irradiation.

14 Claims, 5 Drawing Sheets

(56) References Cited

U.S. PATENT DOCUMENTS

| | | | |
|---|---|---|---|
| 7,691,783 B2 | 4/2010 | Matsuda et al. | |
| 7,705,997 B2 * | 4/2010 | Sakai et al. | 356/511 |
| 7,727,847 B2 | 6/2010 | Tanaka et al. | |
| 7,807,483 B2 | 10/2010 | Yamazaki et al. | |
| 7,919,341 B2 | 4/2011 | Yamazaki et al. | |
| 7,989,812 B2 | 8/2011 | Yamazaki et al. | |
| 8,129,004 B2 | 3/2012 | Matsuo | |
| 8,133,748 B2 | 3/2012 | Yamazaki et al. | |
| 8,319,224 B2 | 11/2012 | Yamazaki et al. | |
| 2004/0217695 A1 | 11/2004 | Yoneda et al. | |
| 2005/0136344 A1 | 6/2005 | Kang et al. | |
| 2005/0157157 A1 | 7/2005 | Tsukamoto et al. | |
| 2006/0233950 A1 | 10/2006 | Kim et al. | |
| 2007/0138460 A1 * | 6/2007 | Choi et al. | 257/13 |
| 2008/0026543 A1 | 1/2008 | Miyairi et al. | |
| 2008/0050895 A1 | 2/2008 | Miyairi et al. | |
| 2008/0057632 A1 | 3/2008 | Arai et al. | |
| 2008/0113292 A1 | 5/2008 | Matsuo | |
| 2008/0182349 A1 | 7/2008 | Yamazaki et al. | |
| 2008/0299496 A1 | 12/2008 | Hirakata et al. | |
| 2008/0305287 A1 | 12/2008 | Ohata et al. | |
| 2009/0075214 A1 | 3/2009 | Hirakata et al. | |
| 2009/0104403 A1 | 4/2009 | Aoyama et al. | |
| 2009/0104721 A1 | 4/2009 | Hirakata et al. | |
| 2009/0104835 A1 | 4/2009 | Aoyama et al. | |
| 2009/0142510 A1 | 6/2009 | Takahashi et al. | |
| 2009/0166563 A1 | 7/2009 | Yokoyama et al. | |
| 2009/0169809 A1 | 7/2009 | Yokoyama et al. | |
| 2012/0056190 A1 | 3/2012 | Yamazaki et al. | |

FOREIGN PATENT DOCUMENTS

| | | |
|---|---|---|
| EP | 1 093 156 A2 | 4/2001 |
| EP | 1 093 166 A2 | 4/2001 |
| EP | 1 093 167 A2 | 4/2001 |
| EP | 1 705 692 A2 | 9/2002 |
| EP | 1 548 857 A1 | 6/2005 |
| JP | 2000-195665 | 7/2000 |
| JP | 2001-185355 | 7/2001 |
| JP | 2001-189192 | 7/2001 |
| JP | 2002-75640 | 3/2002 |
| JP | 2004-87143 | 3/2004 |
| JP | 2005-183381 A | 7/2005 |
| JP | 2006-228649 | 8/2006 |
| JP | 2006-309955 A | 11/2006 |

* cited by examiner

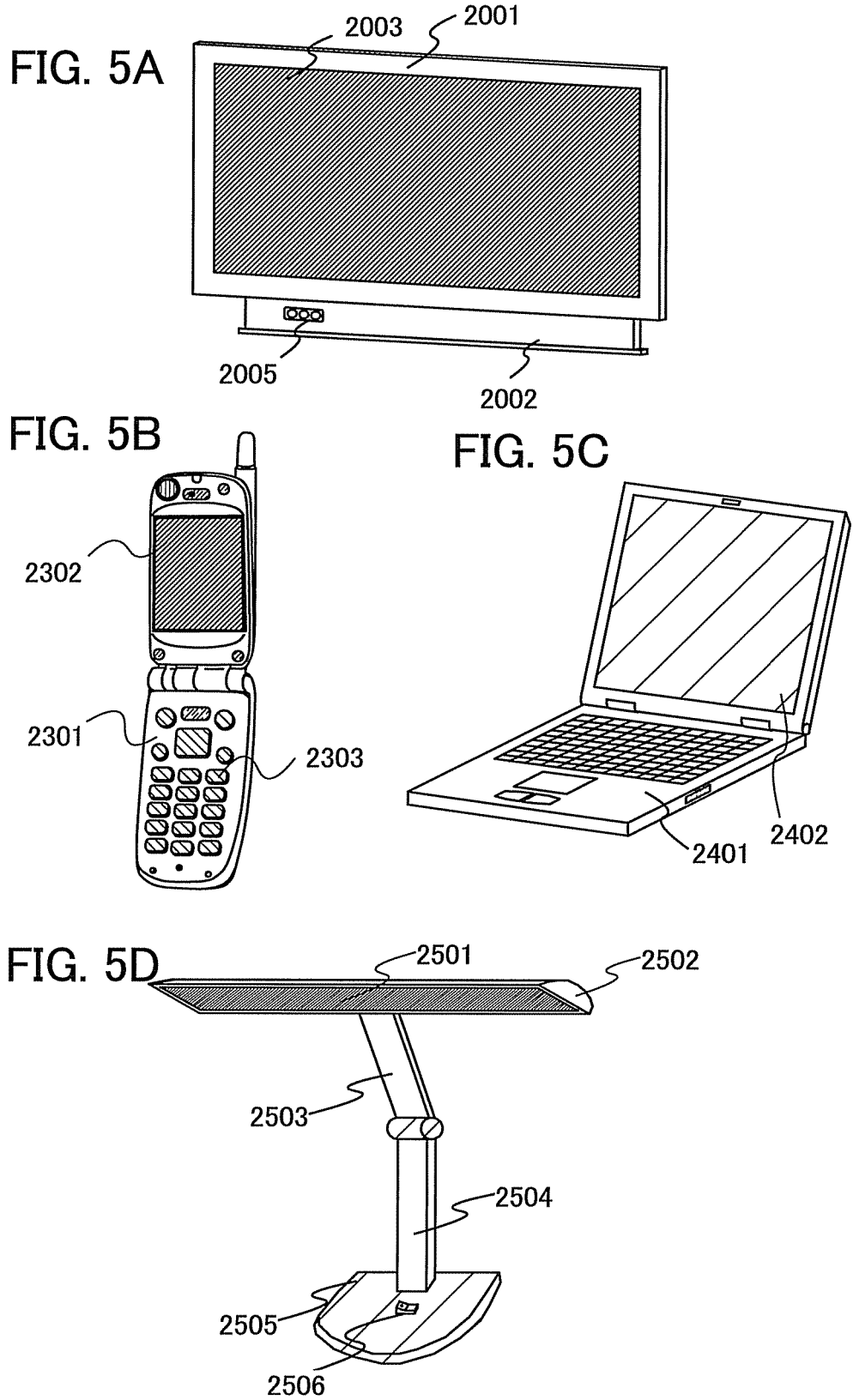

DEPOSITION METHOD AND METHOD FOR MANUFACTURING LIGHT-EMITTING DEVICE

BACKGROUND OF THE INVENTION

1. Field of the Invention

The present invention relates to a deposition method that is used for forming a layer including an organic compound. Further, the present invention relates to a method for manufacturing a light-emitting device in which a layer including an organic compound is used as a light-emitting layer.

2. Description of the Related Art

A light-emitting element using an organic compound as a light-emitting body, which has features such as thinness, lightness, high-speed response, and DC drive at low voltage, is expected to be applied to a next-generation flat panel display. Among display devices, ones having light-emitting elements arranged in matrix are considered to be particularly superior to conventional liquid crystal display devices for their wide viewing angle and excellent visibility.

It is said that, as for a light-emitting mechanism of a light-emitting element, an EL layer is sandwiched between a pair of electrodes and voltage is applied to the EL layer, and thus electrons injected from a cathode and holes injected from an anode are recombined in an emission center of the EL layer to form molecular excitons, and the molecular excitons release energy when returning to a ground state; thus, light is emitted. An excited singlet state and an excited triplet state are known as an excited state, and it is believed that light can be emitted through either state.

An EL layer included in a light-emitting element includes at least a light-emitting layer. In addition, the EL layer can have a stacked structure including a hole injecting layer, a hole transporting layer, an electron transporting layer, an electron injecting layer, and/or the like, in addition to the light-emitting layer.

In addition, an EL material for forming an EL layer is broadly classified into a low molecular (monomer) material and a high molecular (polymer) material. In general, a low molecular material is often deposited by an evaporation method and a high molecular material is often used by an inkjet method, a spin coating method, or the like.

Reference 1 (Japanese Published Patent Application No. 2001-52864) and Reference 2 (Japanese Published Patent Application No. 2001-102170) disclose that an EL layer is formed by an ink-jet method.

In addition, a technique is disclosed in Reference 3 (Japanese Published Patent Application No. 2001-189192) in which an organic EL material is applied from a nozzle in a stripe manner, not in a dotted manner like in an ink-jet method.

In addition, a technique in which an organic EL material is applied by a method unlike an ink-jet method, that is, an application method with the use of a so-called nozzle printing device is also disclosed in Reference 4 (Japanese Published Patent Application No. 2002-75640).

Further, when a light-emitting element is formed using a high molecular material, there is a laser induced thermal imaging (also called LITI) disclosed in Reference 5 (Japanese Published Patent Application No. H10-208881).

In addition, when a light-emitting element is formed using a low molecular material, a method using a laser beam is disclosed in Reference 6 (Japanese Published Patent Application No. 2007-281159). A laser thermal transfer method disclosed in Reference 6 is also called laser induced pattern wise sublimation (LIPS).

By the ink-jet method disclosed in Reference 1 and Reference 2, a material which is to be deposited is dissolved or dispersed in a solvent or the like and liquid including the material is adjusted and prepared so that liquid can be discharged from the nozzle, and then the liquid is discharged from the nozzle, whereby deposition is performed on a deposition target substrate. By the ink-jet method, the amount of a droplet and the position of a droplet discharged from the nozzle are controlled, whereby deposition can be selectively performed on the deposition target substrate.

A disadvantage of the ink-jet method is that when a thin nozzle is clogged up for some reason and clogging occurs, a defective display panel having a dot defect or a line defect is formed.

Also, by the methods disclosed in Reference 3 and Reference 4, liquid including a material is prepared. The methods disclosed in Reference 3 and Reference 4 are superior to an ink-jet method in that there is a wide range of viscosity of a material liquid that can be used and in that a problem such that clogging due to drying of a nozzle tip or the like does not occur.

Note that a deposition target substrate will be part of a display panel later in any of References 1 to 4.

SUMMARY OF THE INVENTION

When those wet processes are used, it is difficult to form a stacked structure on a deposition target substrate to be part of a display panel later. For example, when a second material layer of a second layer is stacked on a first material layer of a first layer, the surface of the first material layer of the first layer is easily dissolved and an organic material included in the first material layer might be mixed into the second material layer.

In addition, depending on a material liquid or a solvent to be used, those wet processes include dry treatment for vaporizing a solvent or the like in each time of stacking a layer on a deposition target substrate that is to be part of a display panel later. The dry treatment takes greater than or equal to 30 minutes; therefore, throughput is reduced as the number of layers to be staked is increased. In addition, a baking temperature varies depending on a material or a solvent to be used; therefore, when the baking temperature of a material layer to be the top layer is higher than a melting temperature of a lower material layer, the interface between stacked layers disappears and a plurality of material layers might be unintentionally mixed to be one layer, for example.

In view of the above problem, an object is to provide a deposition method for smoothly obtaining desired pattern shapes of material layers and a method for manufacturing a light-emitting device while throughput is improved when a plurality of different material layers is stacked on a substrate that is to be part of a display panel later. Another object is to provide a deposition method and a method for manufacturing a light-emitting device for improving throughput in forming a full color light-emitting device.

Thus, a material layer is not selectively formed on a substrate to be part of a display panel later, but a material liquid is applied on a deposition substrate in advance and baked; then, the deposition substrate and a substrate that is to be part of a display panel later are arranged to face each other, and the material layer formed on the deposition substrate is heated by irradiation with a laser beam or lamp light, whereby the material layer is selectively formed on the substrate that is to be part of a display panel later.

In Reference 5, a donor film provided with an organic layer on an entire surface is used, and for example, when a full color light-emitting device that emits light of R, G, and B is formed, at least greater than or equal to three films of a donor film for R, a donor film for G, and a donor film for B are used.

In a similar manner to Reference 5, when a full color light-emitting device that emits light of R, G, and B is formed, at least greater than or equal to three transfer substrates of a transfer substrate for R, a transfer substrate for G, and a transfer substrate for B are used in Reference 6.

Thus, after a plurality of different material liquids is selectively applied on one deposition substrate and baked, the deposition substrate and a substrate that is to be part of a display panel later are arranged to face each other, and plural kinds of material layers formed on the deposition substrate are heated by light irradiation, whereby the plural kinds of material layers are selectively formed on the substrate that is to be part of the display panel later. Thus, when a full color light-emitting device that emits light of R, G, and B is formed, the total number of deposition substrates can be reduced, specifically, the total number of deposition substrates can be two or one.

Discharge is performed from a plurality of nozzles by pump feeding to selectively apply a plurality of different material liquids on one deposition substrate. The pump feeding is controlled in accordance with viscosity of material liquids, a flowmeter, and/or a pressure gauge so that the material liquids discharged on the deposition substrate from the nozzles reach the surface of the deposition substrate from the tips of the nozzles without interruption. Thus, discharge positions of each droplet can be prevented from being different, like an inkjet method, and a droplet can be prevented from being attached to an unintended region.

A manufacturing method disclosed in this specification is a deposition method including the following steps: forming a light absorption layer on one surface of a first substrate; forming a first material layer by discharge of a first material liquid from a first nozzle, a second material layer by discharge of a second material liquid from a second nozzle, and a third material layer by discharge of a third material liquid from a third nozzle over the first substrate; making a surface of the first substrate provided with the first material layer, the second material layer, and the third material layer face a deposition target surface of a second substrate; and irradiating the light absorption layer with light from the other surface side of the first substrate under a reduced pressure, selectively heating at least a portion of each of the first material layer, the second material layer, and the third material layer which is overlapped with the light absorption layer, and forming a layer including a first organic compound, a layer including a second organic compound, and a layer including a third organic compound on the deposition target surface of the second substrate. The material liquids discharged on the first substrate from their respective nozzles reach the surface of the first substrate without interruption from tips of the nozzles.

In the above method, the first organic compound, the second organic compound, and the third organic compound are low molecular materials, and the first material layer, the second material layer, and the third material layer are vaporized by light irradiation, whereby the layer including the first organic compound, the layer including the second organic compound, and the layer including the third organic compound are formed on the second substrate. That is, the first organic compound, the second organic compound, and the third organic compound can be material liquids having viscosity which can be discharged from a nozzle by pump feeding and are low-molecular organic compound materials that can be evaporated by heat.

For example, the following can be given as materials that can be used for an application method and a dry deposition method: carbazole derivatives typified by 9[4-(10-phenyl-9-anthryl)-phenyl]-9H-carbazole (abbreviation: CzPA) and 9-{4-[10-(4-tert-butylphenyl)-9-anthryl]phenyl}-9H-carbazole (abbreviation: PTBCzPA); an aromatic hydrocarbon compound typified by 2-tert-butyl-9,10-di(2-naphthyl)anthracene (abbreviation: t-BuDNA); a metal complex typified by bis(2-methyl-8-quinolinolato)(4-phenylphenolato)aluminum(III) (abbreviation: BAlq); and an aromatic amine compound typified by N,N'-bis(3-methylphenyl)-N,N'-diphenyl-[1,1'-biphenyl]-4,4'-diamine (abbreviation: TPD).

For a solvent to be used for adjustment of the material liquid, more kinds of solvents than those in an ink-jet method can be used. For example, any of the following can be used: halogen solvents such as chloroform, tetrachloromethane, dichloromethane, 1,2-dichloroethane, and chlorobenzene; ketone solvents such as acetone, methyl ethyl ketone, diethyl ketone, n-propyl methyl ketone, and cyclohexanone; aromatic solvents such as benzene, toluene, xylene, or anisole; ester solvents such as ethyl acetate, n-propyl acetate, n-butyl acetate, ethyl propionate, γ-butyrolactone, and diethyl carbonate; ether solvents such as diethyl ether, tetrahydrofuran, and dioxane; amide solvents such as dimethylformamide and dimethylacetamide; alcohol solvents such as ethanol, isopropanol, 2-methoxyethanol, and 2-ethoxyethanol; dimethyl sulfoxide; hexane; water; and the like. A mixture of plural kinds of these solvents may also be used.

In addition, a light absorption layer can be expanded by light irradiation, so that a material layer adjacent to the light absorption layer can be in contact with the second substrate or a structural object (an electrode, a partition, or the like) that is provided for the second substrate, whereby the material layer can be separated from the first substrate.

Note that a buffer layer having a function to facilitate separation of the material layer from the first substrate may be formed between the light absorption layer and the material layer, and any of an organic compound, an inorganic compound, or metal may be used for this buffer layer. As the buffer layer, for example, a material that is decomposed and releases a nitrogen gas or a hydrogen gas when the material absorbs light or heat, (e.g. pentaerythritol tetranitrate (PETN) and the like) can be used. In addition, a thermal conductive layer to efficiently convey heat between the light absorption layer and the material layer may be provided. As a material of the thermal conductive layer, poly α methylstyrene acid or the like can be used.

Another manufacturing method of embodiments of the present invention is a deposition method including the following steps: forming a light absorption layer on one surface of a film having a light-transmitting property; forming a first material layer by discharge of a first material liquid from a first nozzle, a second material layer by discharge of a second material liquid from a second nozzle, and a third material layer by discharge of a third material liquid from a third nozzle over the film having a light-transmitting property; making the one surface of the film having a light-transmitting property provided with the first material layer, the second material layer, and the third material layer face a deposition target surface of a glass substrate; and irradiating the light absorption layer with light from the other surface side of the film having a light-transmitting property, selectively heating at least a portion of each of the first material layer, the second material layer, and the third material layer which is overlapped with the light absorption layer, and forming a layer including a first organic compound, a layer including a second organic compound, and a layer including a third organic compound on the deposition target surface of the glass substrate. The material liquids discharged on the film having a light-transmitting property from their respective nozzles reach the surface of the film having a light-transmitting property without interruption from tips of the nozzles.

By the above method, adhesion between the light absorption layer and the first material layer is decreased by irradiation with the light, the light absorption layer and the first material layer are separated, and the layer including the first organic compound is placed over the glass substrate. Therefore, not only a low molecular material but also a high molecular material can be used as materials for the first material layer, the second material layer, and the third material layer, and there is a wide range of materials that can be used.

In addition, shortening an interval between different material layers which are formed by discharge of different material liquids from different nozzles is preferable, which leads to realizing a high-definition light-emitting display device that has a small pixel spacing. A partition having a desired pattern shape is formed in advance before discharge, and the material liquid is discharged in a region surrounded by the partition. The partition which is provided for the deposition substrate can precisely control a spatial volume of a space that is surrounded by the whole partition in accordance with the height of the partition; therefore, a material liquid can be discharged in a region surrounded by the partition and the quantity of liquid to be held in the region surrounded by the partition can be controlled. This partition can have a function of preventing adjacent material layers from being mixed with each other on the same substrate after plural kinds of material liquids are discharged. In addition, the surface of the partition may be subjected to surface treatment which provides a lyophilic property with respect to the liquid to be discharged or surface treatment which provides a fluid repellent property with respect to the liquid to be discharged.

For the material of the partition, an organic insulating material or an inorganic insulating material is used.

In addition, another method for manufacturing a light-emitting device of embodiments of the present invention includes the following steps: forming a light absorption layer on one surface of a first substrate; selectively forming a first partition surrounding the light absorption layer; discharging plural kinds of material liquids from a plurality of respective nozzles, by pump feeding, and forming and arranging a plurality of material layers in contact with the first partition and the light absorption layer; making the one surface of the first substrate provided with the material layer face a deposition target surface of a second substrate having a first electrode; irradiating the light absorption layer with light from the other surface side of the first substrate, selectively heating at least part of the material layer in a position overlapped with the light absorption layer, and forming a layer including an organic compound over the first electrode provided on the deposition target surface of the second substrate; and forming a second electrode over the layer including the organic compound. A plurality of the first electrodes is provided on the deposition target surface of the second substrate, and a second partition insulating the plurality of the first electrodes is provided.

In the above method, light is emitted in a state that at least parts of the first partition and the second partition are in contact with each other. For example, a cross-section of the first partition may be a projection shape, a cross-section of the second partition may be a trapezoid shape, and alignment may be performed so that only a projection portion of the projection shape of the first partition is in contact with the second partition. Note that not all the cross-sections of the first partition are necessarily projection shapes, and a plurality of projection portions is arranged uniformly so as to keep a fixed substrate interval.

Further, the light absorption layer may be provided on the entire surface or may be provided on part of the surface. If the light absorption layer has a desired pattern shape that is provided partly, a deposition pattern that reflects the pattern shape of the light absorption layer irradiated with light is deposited on a substrate that is to be part of a display panel later. Note that the material layer having a pattern with a top view shape which is substantially the same as the top view shape of the pattern of the light absorption layer can be provided on the substrate that is to be part of a display panel later.

In particular, when a plurality of band-shape light absorption layers is arranged in a stripe manner and a material layer overlapped with the light absorption layers is formed by discharge of material liquids from nozzles by pump feeding, a partition is provided only on both sides of the light absorption layers. Since application of the material liquids can be performed by moving relatively the nozzle and/or a substrate in one direction, film thickness uniformity in the application direction can be enhanced. If a stripe-shaped material layer is formed on the substrate that is to be part of a display panel later, pixel spacing can be designed to be small in an application direction, which contributes to improvement in aperture ratio.

Note that "stripe manner" includes an elongated rectangular shape in which an aspect ratio is greater than or equal to 2:1 and an elongated elliptical shape in which a ratio of major and minor axes is greater than or equal to 2:1 in its meaning.

For a material of the light absorption layer, metal can be used, and chromium, tungsten, tin, nickel, titanium, cobalt, zinc, gold, copper, molybdenum, lead, and the like can be given. In addition, as another material of the light absorption layer, aluminum oxide, silver oxide, metal sulfide, or the like can be used as well as oxide of the aforementioned metal. Further, as another material of the light absorption layer, metal nitride can be used. In particular, it is preferable to use titanium nitride, tantalum nitride, molybdenum nitride, tungsten nitride, or the like as a material of the light absorption layer; it is more preferable to use titanium nitride because of high light absorptance. In addition, as another material of the light absorption layer, an organic film can be used, and for example, a high molecule resin to which carbon black, black lead, or infrared ray dye is added, and the like can be given. Note that since a kind of material that is suitable for the light absorption layer varies in accordance with the wavelength of the irradiation light, the material of the light absorption layer needs to be selected as appropriate. In addition, the light absorption layer is not limited to a single layer and may include a plurality of layers. The light absorption layer can be also called a light-heat conversion layer.

As the irradiation light, light from a lamp light source or a laser beam from a laser light source can be used.

Examples of lamp light sources are as follows: discharge lamps such as a flash lamp (e.g., a xenon flash lamp, a krypton flash lamp, and the like), a xenon lamp, and a metal halide lamp; and exothermic lamps such as a halogen lamp and a tungsten lamp. The flash lamp can repeatedly emit very high intensity light on a large area in a short time (0.1 milliseconds to 10 milliseconds).

As a laser beam used for irradiation, a laser beam oscillated from one or more of the following can be used: a gas laser such as an Ar laser, a Kr laser, or an excimer laser; a solid-state laser such as a single crystalline laser such as YAG, $YVO_4$, forsterite ($Mg_2SiO_4$), $YAlO_3$, $GdVO_4$, or a polycrystalline (ceramic) laser such as YAG, $Y_2O_3$, $YVO_4$, $YAlO_3$, or $GdVO_4$, which is doped with one or more mediums selected from among Nd, Yb, Cr, Ti, Ho, Er, Tm, and Ta, a glass laser, a ruby laser, an alexandrite laser, a Ti:sapphire laser, and a fiber laser. Alternatively, a second harmonic or a third harmonic oscillated from the above-described solid-state laser, and a higher harmonics can be used. Note that, when a solid-state laser whose laser medium is solid is used, there are advantages in that a maintenance-free condition can be maintained for a long time and output is relatively stable.

In addition, the shape of a laser spot is preferably linear or rectangular. With a linear or rectangular laser spot, a laser beam can scan a process substrate efficiently. Thus, time that is necessary for deposition (takt time) is reduced and productivity is improved.

The aforementioned deposition method is used, whereby at least one layer of the EL layer which forms a light-emitting element, for example, different light-emitting layers can be formed on one substrate. In addition, the light absorption layer has an area that is substantially the same as an area to serve as a pixel portion, and a partition having an opening with which a material liquid is formed into a desired pattern shape is used, whereby deposition can be performed only in a desired region. Further, the light absorption layer is formed into a desired pattern shape, whereby deposition can be performed only in a desired region. In this manner, deposition can be performed only in a desired region; therefore, a minute pattern can be formed and a high-definition light-emitting device can be formed.

When a full color light-emitting device is formed, light-emitting layers are needed to be separately formed; therefore, light-emitting layers can be easy to be separately formed by employing a deposition method of embodiments of the present invention. For example, a deposition apparatus which at least includes a nozzle that discharges a first material liquid including a red light-emitting material, a nozzle that discharges a second material liquid including a green light-emitting material, and a nozzle that discharges a third material liquid including a blue light-emitting material is used, and three kinds of light-emitting layers can be deposited on one deposition substrate. Further, one deposition substrate on which three kinds of light-emitting layers are deposited is used and irradiated with light, whereby three kinds of light-emitting layers can be formed in a short time on a deposition target substrate (the substrate that is to be part of a display panel later) that is provided so as to face the deposition substrate. In addition, three kinds of light-emitting layers can be deposited with positional accuracy by performing only one position alignment in any of embodiments of the present invention.

Depending on an area irradiated with light which is emitted on a light absorption layer of the deposition substrate, a plurality of different material layers can be heated at the same time. However, a distance between a pair of substrates (two substrates: the deposition substrate and the target substrate that is to be part of a display panel later) is reduced in light irradiation, whereby a color mixture can be prevented. In particular, when the first substrate is a film, a color mixture can be prevented because the film and the second substrate are placed in close contact with each other. Note that in this specification, the distance between substrates is defined by the shortest distance of the two substrates which face each other.

Unlike a conventional case where an EL layer is formed using a wet method, it is not necessary to consider the solubility or the like of a layer that has been already formed; therefore, there are more choices of kinds of materials which are used for deposition. In addition, the number of layers to be stacked can also be set freely. Accordingly, a light-emitting device having a desired stacked structure can be formed using a desired material. In particular, when the size of a substrate is increased, it is important that the kinds of materials to be used and a stacked structure can be set freely in terms of improving performance of a light-emitting device.

BRIEF DESCRIPTION OF THE DRAWINGS

FIGS. 5A to 5D each illustrate an example of an electronic device.

DETAILED DESCRIPTION OF THE INVENTION

Embodiments of the present invention are hereinafter described.

(Embodiment 1)

In this embodiment, a deposition substrate according to one of embodiments of the present invention and a deposition method using the deposition substrate will be described. Note that in this embodiment, the case where a red light-emitting layer, a green light-emitting layer, and a blue light-emitting layer are deposited with intervals to form a full color light-emitting device will be described with reference to FIGS. 1A to 1D and FIGS. 2A to 2C. In this specification, a substrate that is provided with a material which is desired to be deposited and that is used to perform deposition on a deposition target substrate is referred to as a deposition substrate (a first substrate) hereinafter. In addition, a substrate that is to be part of a display panel later is referred to as a second substrate.

A light absorption layer 102 is formed over a first substrate 104 which is a deposition substrate. For the first substrate 104, a glass substrate, a quartz substrate, or the like can be used, for example.

The light absorption layer 102 is patterned to correspond to a region in which a film is desired to be deposited of the second substrate. Note that the light absorption layer 102 is not necessarily patterned, and the light absorption layer 102 may be formed on the entire first substrate. In addition, a first partition 121 is provided over the light absorption layer 102. The surface of the first partition 121 is preferably subjected to lyophilic treatment in advance and plays a role to assist positional control of a material liquid discharged from a nozzle. Note that the first partition is not necessarily provided as long as the distance between a plurality of different material layers can be reduced by discharge from a plurality of nozzles or a plurality of different material layers can be adjacent to each other without plural kinds of different materials included in the plurality of different material layers mixed even if the first partition is not provided.

Figure 1A:
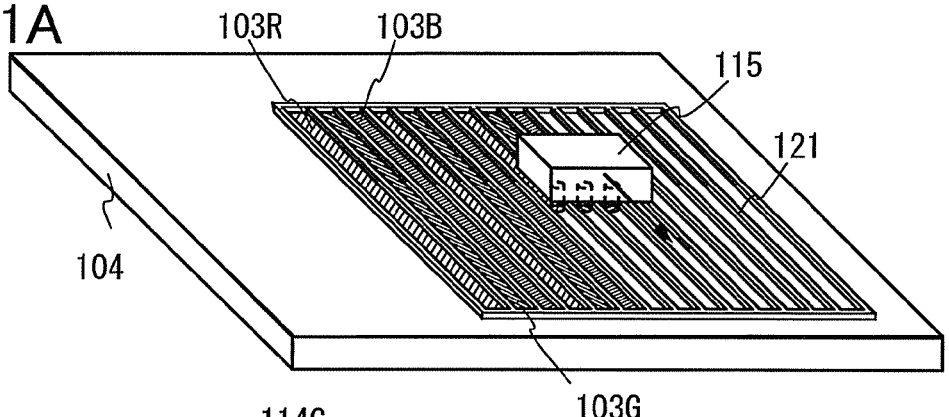
FIGS. 1A to 1D are a perspective view and cross-sectional views illustrating a manufacturing process of a light-emitting device.

FIG. 1A is a perspective view during discharge of three different kinds of material liquids from three nozzles provided in a head portion 115 and formation of a material layer in openings of the first partition 121. A cross-sectional view corresponding to FIG. 1A is FIG. 1B, and a first material liquid 114R is discharged from a nozzle 113R for a red light-emitting layer by pump feeding. In addition, a third material liquid 114B is discharged from a nozzle 113B for a blue light-emitting layer by pump feeding. Further, a second material liquid 114G is discharged from a nozzle 113G for a green light-emitting layer by pump feeding. Note that the first material liquid 114R, the second material liquid 114G, and the third material liquid 114B each include a low-molecular organic compound. As EL materials included in these material liquids, materials which can be used for both an application method and a dry deposition method are used.

For the first material liquid 114R including a red light-emitting material for forming a red light-emitting layer to be formed on the deposition substrate, 2-methoxyethanol can be used as a solvent and discharge is performed, whereby a red light-emitting layer including TPD and (acetylacetonato)bis(2,3,5-triphenylpyradinato)iridium(III) (abbreviation: Ir(tppr)$_2$(acac)) and including BAlq as a host can be formed. In addition, for the second material liquid 114G including a green light-emitting material for forming a green light-emitting layer to be formed on the deposition substrate, toluene is used as a solvent and discharge is performed, whereby a green light-emitting layer including N-(9,10-diphenyl-2-anthryl)-N,9-diphenyl-9H-carbazol-3-amine (abbreviation: 2PCAPA) and including CzPA as a host can be formed. In addition, for the third material liquid 114B including a blue light-emitting material for a blue light-emitting layer to be formed on the deposition substrate, toluene is used as a solvent and discharge is performed, whereby a blue light-emitting layer including N,9-diphenyl-N-[4-(10-phenyl-9-anthryl)phenyl]-9H-carbazol-3-amine (abbreviation: PCAPA) and including CzPA as a host can be formed.

The nozzle is connected to a material liquid feeding pump through a tube that serves as a flow path of the material liquid from a bottle which stores the material liquid, and the material liquid is discharged from an opening of the nozzle by pressure feed by the material liquid feeding pump. For the material liquid feeding pump, a pump such as a sandpump, a piston pump, or a squeeze pump, or a tank apparatus can be used. Note that a flowmeter, a pressure gauge, a thermometer, a filter that removes a foreign substance, and/or the like are/is provided between the material liquid feeding pump and the nozzle, and the flow rate is controlled so that the material liquid flows from the opening of the nozzle at a fixed flow rate. The nozzle and the first substrate 104 are relatively moved, whereby the material liquid is drawn. Note that discharge from the nozzle can be started and stopped by controlling the pressure of the material liquid feeding pump.

Figure 1B:
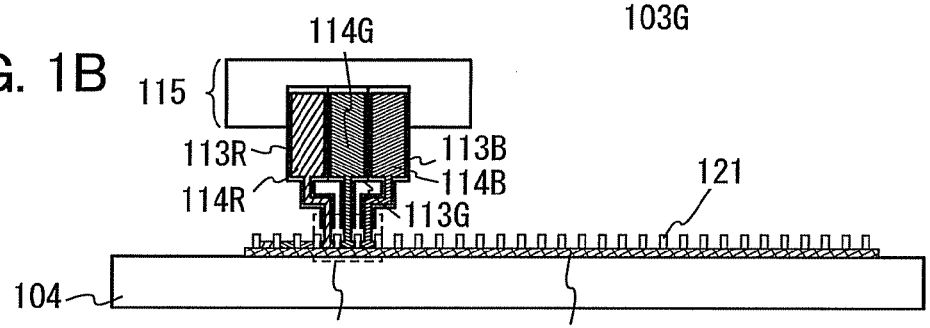
Figure 1C:
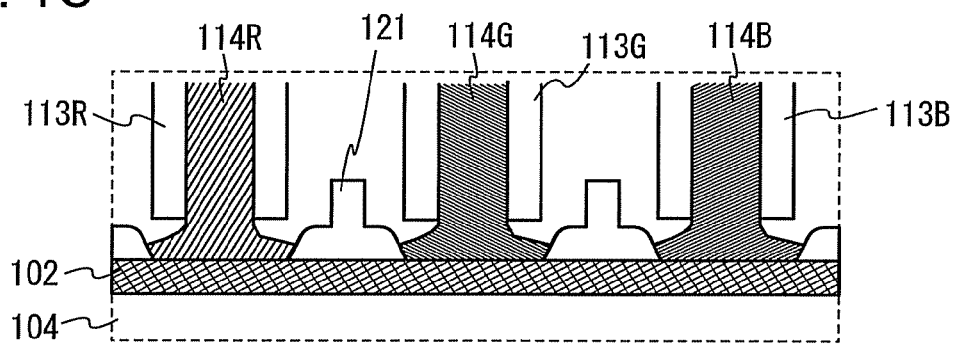

In addition, an expanded sectional view of a nozzle tip periphery 118 illustrated in a portion surrounded by a dotted line of FIG. 1B is illustrated in FIG. 1C. Each material liquid is connected to both a nozzle tip and the light absorption layer, as illustrated in FIG. 1C. The pump feeding is controlled in accordance with viscosity of a material liquid, a flowmeter, and/or a pressure gauge so that the material liquids discharged on the first substrate from their respective nozzles reach the light absorption layer 102 on the first substrate from the tips of the nozzles without interruption.

In addition, the first partition 121 has a projection shape having a projecting portion. The spatial volume of a space that is surrounded by the whole partition of the first partition provided on the deposition substrate can be controlled precisely in accordance with the height of the partition; therefore, the material liquid can be discharged in the region surrounded by the partition and the amount of liquid held in the region surrounded by the partition can be controlled.

After the discharge of the material liquid, heat treatment for drying or baking is performed, if necessary.

By the above-described steps, as illustrated in FIG. 1A, a first material layer 103R, a second material layer 103G, and a third material layer 103B are formed in their respective regions surrounded by the first partition 121 over the first substrate 104.

Figure 1D:
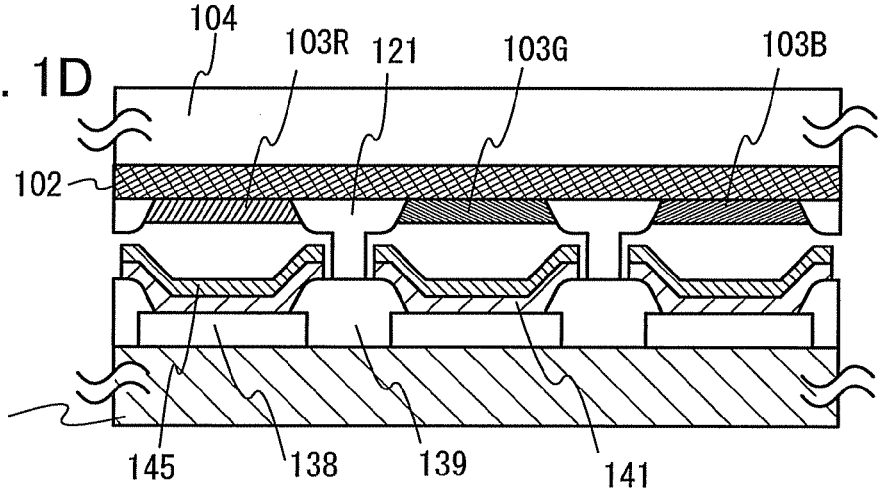

Next, as illustrated in FIG. 1D, a second substrate 137 that is to be part of a display panel later is placed in a position opposite one surface of the first substrate 104 which is provided with the light absorption layer 102, the first material layer 103R, the second material layer 103G, and the third material layer 103B.

A first electrode 138 to serve as one electrode of a light-emitting element and a second partition 139 are formed on the second substrate 137 in advance. In addition, a hole injecting layer 141 and a hole transporting layer 145 are also stacked. Note that the hole injecting layer 141 and the hole transporting layer 145 may be formed using a conventional resistance heating method or the like, or using a deposition method of one of embodiments of the present invention.

Then, the first substrate 104 and the second substrate 137 are aligned under a reduced pressure, and the first partition 121 and the second partition 139 are in contact with and face each other.

Figure 2A:
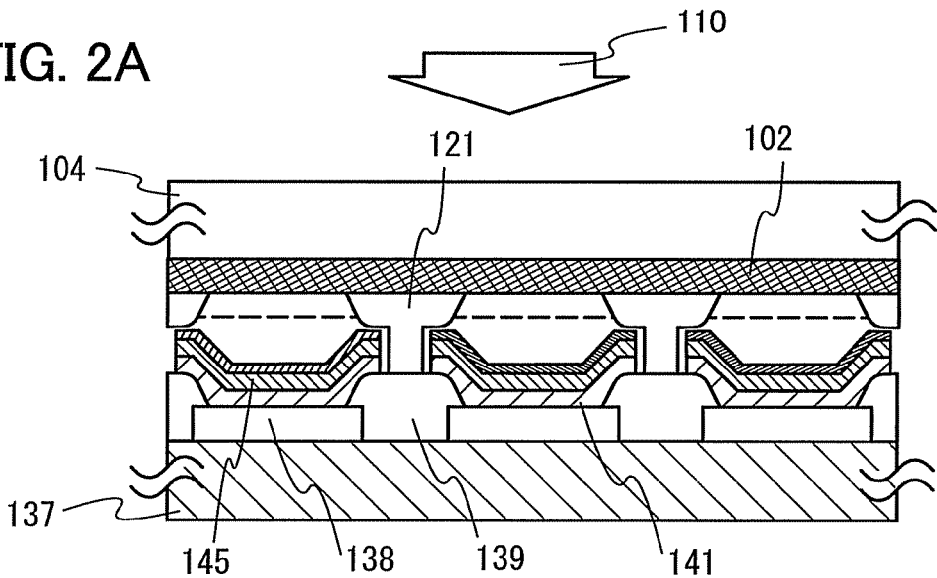
FIGS. 2A to 2C are cross-sectional views illustrating a manufacturing process of a light-emitting device.
Figure 2B:
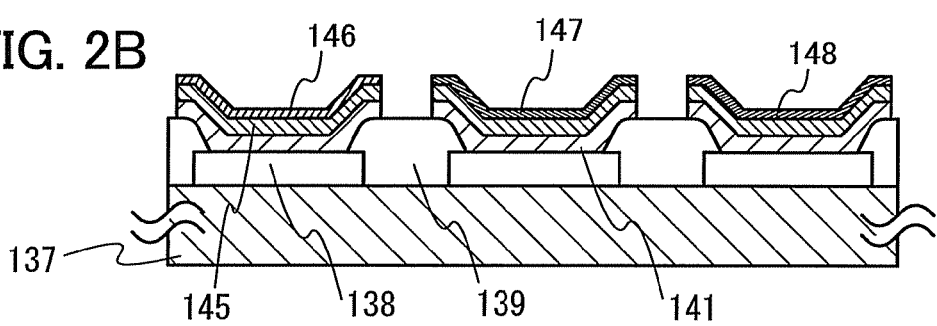
Figure 2C:
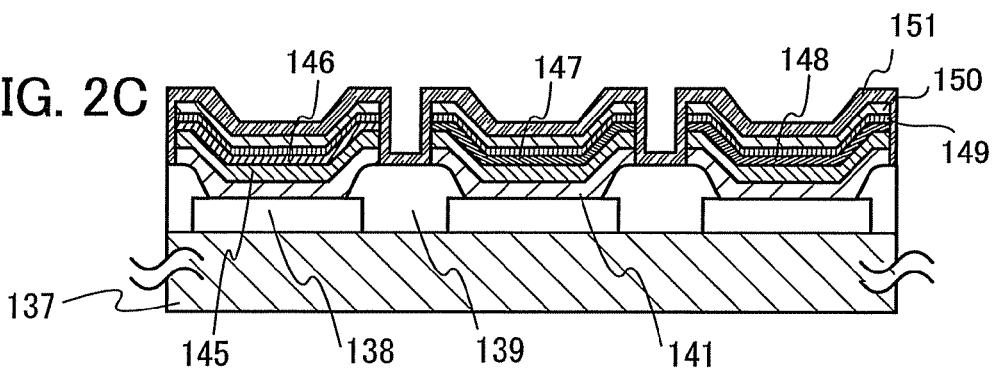

Next, as illustrated in FIG. 2A, light 110 is emitted from a back surface side of the first substrate 104 (from a surface where the light absorption layer 102, the first material layer 103R, the second material layer 103G, and the third material layer 103B are not formed) under a reduced pressure. As the light 110, light of a lamp light source or light of a laser light source is used. In this embodiment, a solid-state laser is used as a laser light source, and a plurality of laser light sources is moved above a pair of substrates, whereby a laser beam is scanned. At this time, light emitted to the light absorption layer 102 formed on the first substrate 104 is absorbed.

Then, light that is absorbed by the light absorption layer 102 is converted into heat, and the heat is given to the first material layer 103R, the second material layer 103G, and the third material layer 103B in the regions that are in contact with the light absorption layer 102, whereby at least a portion of each of the first, second, and third material layers is evaporated and deposition is performed on a region overlapped with the first electrode 138 formed over the second substrate 137. Here, a red light-emitting layer 146, a green light-emitting layer 147, and a blue light-emitting layer 148 of a light-emitting element are formed over the second substrate 137 at the same time by laser irradiation.

After the light-emitting layers are formed, an electron transporting layer 149 and an electron injecting layer 150 are stacked over the light-emitting layers, and finally a second electrode 151 is formed. For the second electrode 151 and the first electrode 138, any of various types of metals, alloys, electrically-conductive compounds, a mixture thereof, and the like can be used. Specific examples are given below: indium tin oxide (ITO), indium tin oxide containing silicon or silicon oxide, indium zinc oxide (IZO), and indium oxide containing tungsten oxide and zinc oxide. In addition, gold (Au), platinum (Pt), nickel (Ni), tungsten (W), chromium (Cr), molybdenum (Mo), iron (Fe), cobalt (Co), copper (Cu), palladium (Pd), nitride of a metal material (such as titanium nitride), and the like can be given.

These materials are usually deposited by a sputtering method. For example, a film of indium zinc oxide can be formed by a sputtering method using a target in which zinc oxide is added to indium oxide at 1 wt % to 20 wt %. A film of indium oxide containing tungsten oxide and zinc oxide can be formed by a sputtering method using a target in which tungsten oxide and zinc oxide are added to indium oxide at 0.5 wt % to 5 wt % and 0.1 wt % to 1 wt %, respectively. Alternatively, by application of a sol-gel method or the like, an inkjet method, a spin coating method, or the like may be used for the formation.

Furthermore, aluminum (Al), silver (Ag), an alloy containing aluminum, or the like can be used. Moreover, any of the following materials having a low work function can be used: elements which belong to Group 1 and Group 2 of the periodic table, that is, alkali metals such as lithium (Li) and cesium (Cs) and alkaline-earth metals such as magnesium (Mg), calcium (Ca), and strontium (Sr), and alloys thereof (an alloy of aluminum, magnesium, and silver, and an alloy of aluminum and lithium); rare earth metals such as europium (Eu) and ytterbium (Yb), and alloys thereof; and the like.

A film of an alkali metal, an alkaline earth metal, or an alloy including these can be formed by vacuum evaporation. In addition, an alloy including an alkali metal or an alkaline earth metal can be formed by a sputtering method. Further, silver paste or the like can be deposited by an ink-jet method or the like. The first electrode 138 and the second electrode 151 are not limited to a single-layer film and can be formed as a stacked-layer film.

Note that in order to extract light emitted from the EL layer formed using a stack including a light-emitting layer to the outside, one or both of the first electrode 138 and the second electrode 151 is/are formed so as to transmit light. For example, the first electrode 138 or the second electrode 151 is formed using a conductive material having a light-transmitting property, such as indium tin oxide, or silver, aluminum, or the like is formed to a thickness of several nanometers to several tens of nanometers. Alternatively, the first electrode 138 or the second electrode 151 can have a stacked structure including a thin film of a metal such as silver or aluminum and a thin film of a conductive material having a light-transmitting property, such as ITO.

By the above steps, a light-emitting diode having at least the first electrode, the second electrode, and the light-emitting layer which is provided between the first electrode and the second electrode is formed over the second substrate 137.

Note that when a passive matrix light-emitting device is formed, at least a stripe-shaped first electrode is formed over the second substrate. In addition, when an active matrix light-emitting device is formed, the second substrate is provided with the first electrode and a switching element electrically connected to the first electrode. An example of the switching element includes a thin film transistor which has any of an amorphous semiconductor film, a polycrystalline semiconductor film, a microcrystal semiconductor film, and a single-crystal semiconductor film as an active layer.

In this embodiment, the example of a full color light-emitting device which is formed using three colors of the red light-emitting layer, the green light-emitting layer, and the blue light-emitting layer is described; however, there is no particular limitation, and a light-emitting device may be further provided with a white light-emitting layer or may be provided with light-emitting layers of greater than or equal to four colors.

In addition, the electron transporting layer 149 and the electron injecting layer 150 can also be deposited in a step that is similar to that of the light-emitting layer. In that case, a deposition substrate for depositing the electron transporting layer and a deposition substrate for depositing the electron injecting layer may be prepared. Furthermore, the thickness of the electron transporting layer and/or the electron injecting layer may vary according to an emission color, which makes it possible to provide a light-emitting device from which light of each color can be extracted efficiently.

Here, the example, in which five EL layers provided between the first electrode and the second electrode, that is, the hole injecting layer, the hole transporting layer, the light-emitting layer, the electron transporting layer, and the electron injecting layer are stacked, is described; however, there is no particular limitation. The hole transporting layer, the light-emitting layer, and the electron transporting layer may be stacked, and a practitioner should design as appropriate in consideration of a light-emitting material, luminous efficiency, and the like.

For selective light irradiation, a reflective layer that reflects light may be partly provided on a surface of the first substrate 104 opposite the surface where the light absorption layer 102 is provided. In addition, the surface of the first substrate 104 where the light absorption layer 102 is provided may be provided with a reflective layer partly. As a material of the reflective layer, silver or a silver alloy is used. In addition, as another material of the reflective layer, aluminum, gold, copper, or an alloy including any of these can be used.

Moreover, in manufacture of a light-emitting device capable of full-color display which is described in this embodiment, by applying any of embodiments of the present invention, a desired material can be deposited over the deposition target substrate without being wasted. Thus, use efficiency of a material is increased, and manufacturing cost can be reduced.

In any of embodiments of the present invention, the thickness of the material layer formed on the deposition substrate is controlled by pump feeding, whereby the thickness of a film deposited on a deposition target substrate can be controlled; therefore, a film thickness monitor is not needed in deposition on the deposition target substrate. Therefore, a user does not have to adjust the deposition speed with a film thickness monitor, and the deposition process can be fully automated. Accordingly, productivity can be increased.

(Embodiment 2)

In this embodiment, an example which employs a method that is different from that in Embodiment 1 will be described with reference to FIGS. 3A to 3D.

A film having a light-transmitting property is used as a first substrate 304 which is a deposition substrate. As the film having a light-transmitting property, for example, polyester, poly acrylic, poly epoxy, polyethylene, polystyrene, or the like is used, and the thickness of the film is from 10 μm to 500 μm.

The first substrate 304 is provided with a light absorption layer 302. The light absorption layer 302 is patterned so as to correspond to a region in which a film is desired to be deposited over a second substrate. Here, a top shape of the light absorption layer 302 is an elongated rectangle. Note that the light absorption layer 302 is not necessarily patterned, and the light absorption layer 302 may be formed on the entire first substrate. In addition, a first partition 321 is provided over the light absorption layer 302. Note that the first partition is not necessarily provided as long as the distance between a plurality of different material layers can be reduced by discharge from a plurality of nozzles or a plurality of different material layers can be adjacent to each other without plural kinds of different materials included in the plurality of different material layers mixed even if the first partition is not provided.

Figure 3A:
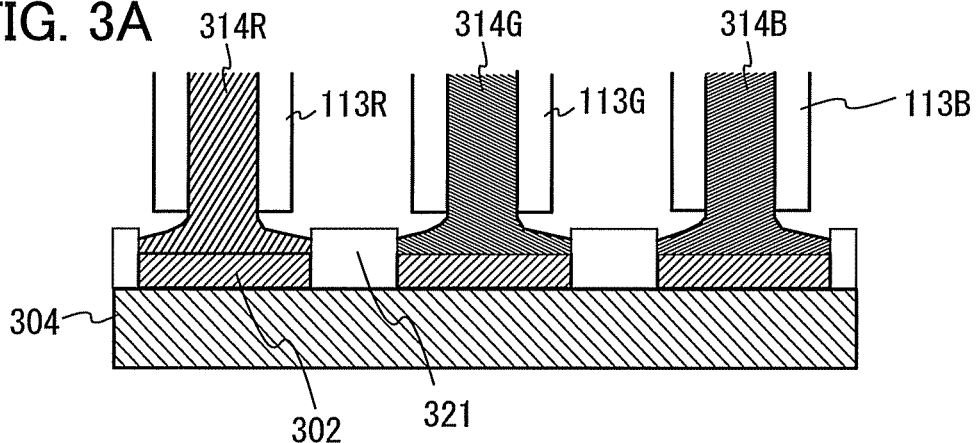
FIGS. 3A to 3D are cross-sectional views illustrating a manufacturing process of a light-emitting device.

FIG. 3A is a cross-sectional view during discharge of three different kinds of material liquids from three nozzles provided in a head portion and formation of a material layer over the light absorption layer 302. The material layer can be formed using the same deposition apparatus as in Embodiment 1. Note that the portions which are the same as those in FIGS. 1A to 1D are denoted by the same reference numerals.

A first material liquid 314R is discharged from the nozzle 113R for a red light-emitting layer by pump feeding. In addition, a second material liquid 314B is discharged from the nozzle 113B for a blue light-emitting layer by pump feeding. Further, a third material liquid 314G is discharged from the nozzle 113G for a green light-emitting layer by pump feeding.

Note that the first material liquid 314R, the second material liquid 314G, and the third material liquid 314B each include a high molecular organic compound. Needless to say, in this embodiment, a material layer is not vaporized as described in Embodiment 1; therefore, a low molecular organic material as well as a high molecular organic compound can be used for the material liquids.

Figure 3B:
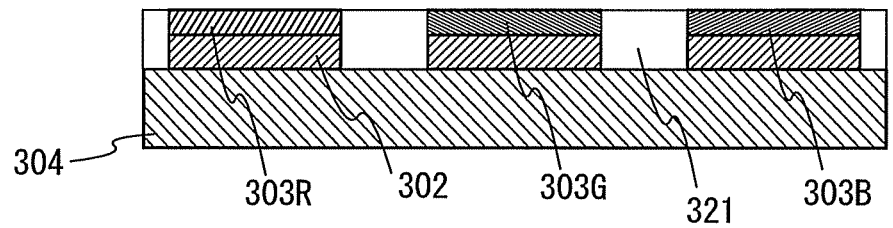

By the above-described steps, a first material layer 303R, a second material layer 303G, and a third material layer 303B are formed over the first substrate 304, as illustrated in FIG. 3B.

Next, a second substrate 337 is a substrate that is to be part of a display panel later. The second substrate 337 is placed in close contact with the first substrate 304 in a position which is one surface of the first substrate 304 and which is provided with a surface where the light absorption layer 302, the first material layer 303R, the second material layer 303G, and the third material layer 303B are formed.

Because the first substrate 304 is flexible, the first substrate 304 can be placed in close contact with the second substrate 337. As a method for close contact arrangement, there are a method using a magnet or an electromagnet, and a method by which pressure is added to the first substrate 304. The second substrate 337 is a glass substrate or a quartz substrate.

A first electrode 338 to serve as one electrode of a light-emitting element and a second partition 339 are formed over the second substrate 337 in advance.

Figure 3C:
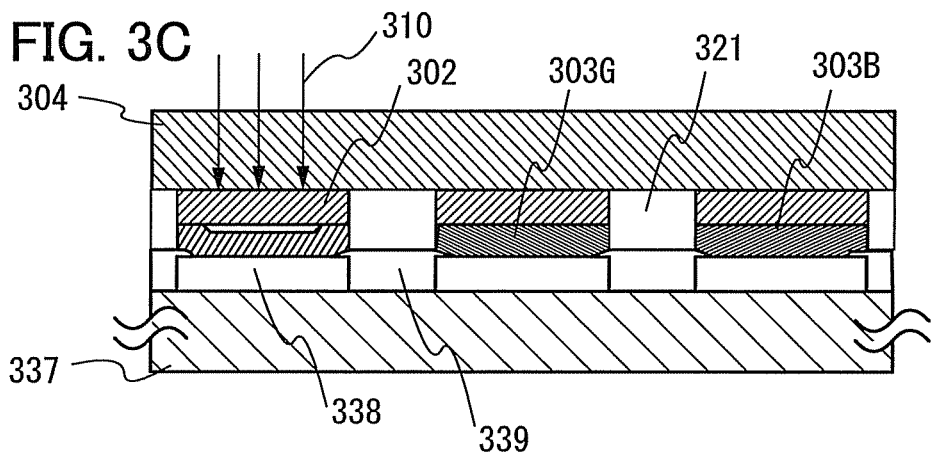

Next, as illustrated in FIG. 3C, light 310 is emitted from a back surface side of the first substrate 304 (from a surface where the light absorption layer 302, the first material layer 303R, the second material layer 303G, and the third material layer 303B are not formed) under a reduced pressure. As the light 310, light of a lamp light source or light of a laser light source is used. In this embodiment, movement of a laser light source and movement of a pair of substrates are combined, whereby a laser beam is scanned. At this time, light emitted to the light absorption layer 302 formed on the first substrate 304 is absorbed.

Figure 3D:
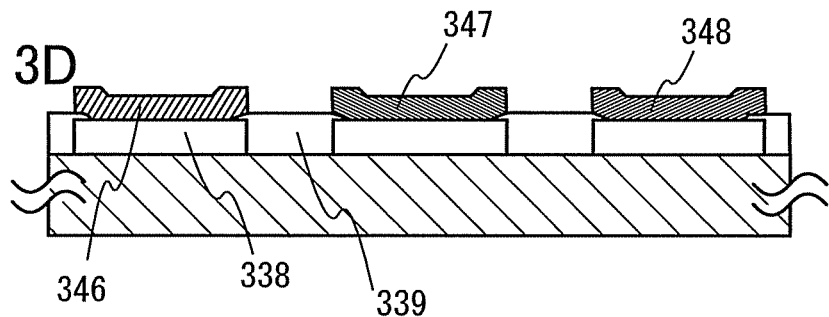

Then, light that is absorbed by the light absorption layer 302 is converted into heat, the light absorption layer expands in a direction perpendicular to a substrate surface by the heat, and the first material layer 303R, the second material layer 303G, and the third material layer 303B in the regions that are in contact with the light absorption layer 302 also expand, whereby the first electrodes 338 formed over the second substrate 337 are placed in close contact with the material layers, and adhesion between the material layers and the light absorption layer 302 is decreased. Accordingly, the material layers and the light absorption layer are separated from each other, and the first electrode 338 and the material layers are fixed to each other. FIG. 3C is an example during separation and in which selective irradiation with the light 310 illustrated by arrows is performed. Then, a laser beam is scanned, and a red light-emitting layer 346 of a light-emitting element, a green light-emitting layer 347 of a light-emitting element, and a blue light-emitting layer 348 of a light-emitting element are formed over the second substrate 337 as illustrated in FIG. 3D.

In addition, a buffer layer which facilitates separation of the first material layer 303R, the second material layer 303G, and the third material layer 303B may be formed between the light absorption layer 302 and the material layers.

Not only a low molecular material but also a high molecular material can be used as materials which are used for the first material layer 303R, the second material layer 303G, and the third material layer 303B, and there is a wide range of materials that can be used.

After the light-emitting layer is formed, an electron transporting layer and an electron injecting layer are stacked over the light-emitting layer, and finally a second electrode is formed. Note that the second electrode is deposited by a sputtering method, an electron-beam method, or the like. By the above steps, a light-emitting diode having at least the first electrode, the second electrode, and the light-emitting layer which is provided between the first electrode and the second electrode is formed over the second substrate 337.

The example in which one light-emitting layer is formed over the first electrode 338 is described in this embodiment; however, there is no particular limitation, and a hole injecting layer, a hole transporting layer, or the like may be formed before the light-emitting layer is formed.

Note that when a passive matrix light-emitting device is formed, the second substrate is provided with at least a stripe-shaped first electrode. In addition, when an active matrix light-emitting device is formed, the second substrate is provided with the first electrode and a switching element that is electrically connected to the first electrode. An example of the switching element includes a thin film transistor which has any of an amorphous semiconductor film, a polycrystalline semiconductor film, a microcrystal semiconductor film, and a single-crystal semiconductor film as an active layer.

Embodiments of the present invention including the structure will be described in more detail in the following example.

EXAMPLE 1

In this example, an example in which an active matrix light-emitting device is formed is described.

First, a deposition substrate is prepared in accordance with Embodiment 1 or Embodiment 2. Note that an example in which a full color display device is formed is described in this example. Here, three kinds of different material liquids are discharged from their respective nozzles, and one deposition substrate (a first substrate) provided with three kinds of material layers is prepared.

Figure 4A:
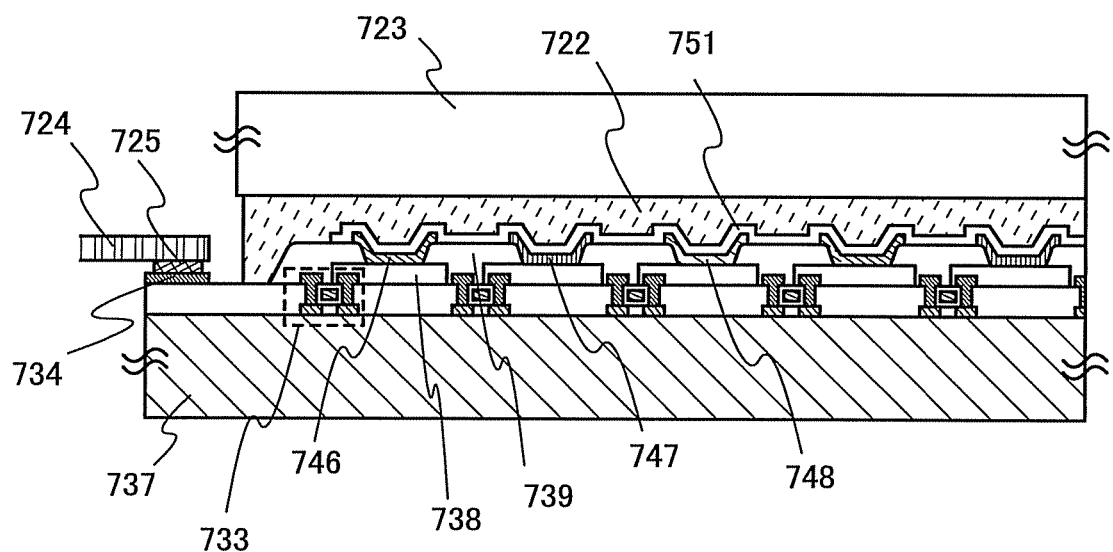
FIGS. 4A and 4B are a cross-sectional view of an active matrix EL display device and a perspective view of a display panel.

Then, a second substrate 737 provided with at least a switching element 733 and a first electrode 738 is prepared (see FIG. 4A). A thin film transistor (TFT) is used for the switching element 733, and at least one terminal is electrically connected to the first electrode 738. In this example, a control TFT and a switching TFT are provided so that current flows in one first electrode 738. These TFTs are top gate TFTs and formed by a known method.

A partition 739 is provided over the second substrate 737 to insulate adjacent first electrodes 738 from one another.

A connecting terminal 734 which is an attached portion of an FPC is also formed over the second substrate 737.

Note that a hole injecting layer (or a hole transporting layer) or the like may be deposited over the first electrode 738 in advance by a resistance heating method or the like.

Then, the first substrate and the second substrate 737 face each other and are aligned and irradiated with light. Three kinds of material layers are formed over the first electrode 738 by irradiation with light. Conventionally, deposition steps are performed three times for red, blue, and green light-emitting layers, or three deposition substrates are used. However, in this example, one deposition substrate provided with three kinds of material layer is used, and a red light-emitting layer 746, a green light-emitting layer 747, and a blue light-emitting layer 748 can be formed in a pixel for red light emission, a pixel for green light emission, and a pixel for blue light emission, respectively. A light-emitting layer can be formed in a short time, whereby the length of time until a second electrode 751 is formed can be reduced. If a period of time when the light-emitting layers are not protected and are exposed or the time when the light-emitting layers are not sealed gets longer, reliability of a light-emitting device might be decreased; therefore, this manufacturing method is useful.

Next, the second electrode 751 is formed, whereby a light-emitting element having the first electrode, the second electrode, and an EL layer including an organic compound between the first electrode and the second electrode is formed. Note that before the second electrode 751 is formed, an electron injecting layer (or an electron transporting layer) or the like may be formed over the light-emitting layers.

Next, a third substrate 723 is prepared, and the light-emitting element provided over the second substrate 737 is sealed using an adhesive sheet 722. When light of the light-emitting element is taken out by passing through the second substrate 737, it is necessary that the second substrate 737 and the adhesive sheet 722 have sufficient light-transmitting properties. Therefore, when light of the light-emitting element is taken out by passing through the second substrate 737, a material having a light-transmitting property is used for the second substrate 737 and the adhesive sheet 722.

When many panels are taken out using a large area substrate as the second substrate, the second substrate is divided into display panels. Note that a practitioner should determine the timing of division, as appropriate. For example, division is performed after the second electrode is formed or after sealing is performed using the third substrate.

Next, an FPC 724 is connected to the connecting terminal 734 through an anisotropic conductive layer 725, and electrical connection to the outside is obtained. Note that a display panel to which the flexible printed circuit (FPC) is attached is referred to as an EL display module. Instead of the FPC, a tape automated bonding (TAB) tape or a tape carrier package (TCP) may be used.

Through the above manufacturing process, an active matrix light-emitting device illustrated in FIG. 4A can be formed.

Figure 4B:
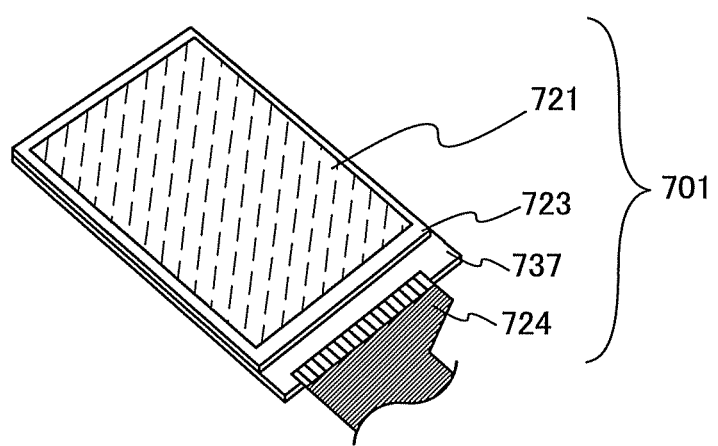

A perspective view of a display panel 701 is illustrated in FIG. 4B. In the display panel 701, the second substrate 737 provided with a pixel portion 721 in which light-emitting elements are arranged in matrix is attached to the third substrate 723 that faces the second substrate by using an adhesive sheet.

Here, an example is described using a top-gate TFT; however, any of embodiments of the present invention can be applied regardless of a TFT structure, and it can be applied to a bottom-gate (inversely staggered type) TFT or a staggered TFT, for example.

In this example, a semiconductor film including silicon as its main component, a semiconductor film including an organic material as its main component, or a semiconductor film including metal oxide as its main component can be used as the semiconductor layer serving as an active layer of the TFT. As the semiconductor film including silicon as its main component, an amorphous semiconductor film, a semiconductor film having a crystalline structure, a compound semiconductor film having an amorphous structure, or the like can be used. Specifically, amorphous silicon, microcrystal silicon, polycrystalline silicon, or the like can be used for the semiconductor film including silicon as its main component.

As the semiconductor film including an organic material as its main component, a semiconductor film containing, as its main component, a substance which includes a certain amount of carbon or an allotrope of carbon (excluding diamond), which is combined with another element, can be used. Specifically, pentacene, tetracene, a thiophen oligomer derivative, a phenylene derivative, a phthalocyanine compound, a polyacetylene derivative, a polythiophene derivative, a cyanine dye, and the like are given as examples. As for the semiconductor film including metal oxide as its main component, zinc oxide (ZnO); indium gallium zinc oxide (In—Ga—Zn—O); or the like can be used.

When amorphous silicon, microcrystal silicon, or polycrystalline silicon is used, a driver circuit can be formed on the same substrate as the pixel portion. Further, another circuit (such as an optical sensor circuit or a CPU) may be formed over the same substrate as the driver circuit.

The display panel 701 thus obtained can be incorporated in an electronic device as a display portion or a light-emitting device. As electronic devices, the following can be given: a camera such as a video camera or a digital camera, a goggle-type display (a head mounted display), a navigation system, a sound reproduction system (such as a car audio system, audio components), a laptop personal computer, a game machine, a personal digital assistant (such as a mobile computer, a cellular phone, a portable game machine, or an e-book reader), and an image reproduction system provided with a recording medium (specifically, a system provided with a display that can reproduce content of a recording medium such as a digital versatile disc (DVD) and display the image). Specific examples of such electronic devices are illustrated in FIGS. 5A to 5D.

FIG. 5A illustrates a large-sized display device having a 22-inch to 50-inch large screen, which includes a chassis 2001, a support 2002, a display portion 2003, a video input terminal 2005, and the like. The display portion 2003 corresponds to the display panel 701 of this example. Note that the display device includes all display devices for displaying information such as for a personal computer, TV broadcast reception, and interactive TV. When a glass substrate of the fifth generation or later having a side of more than 1000 mm is used for the first substrate, a material liquid can be discharged from a nozzle. According to one of examples of the present invention, a large-sized display device with reduced production cost in which a glass substrate of the fifth generation or later having a side of more than 1000 mm is used for the second substrate can be realized.

The cellular phone as illustrated in FIG. 5B is provided with a display panel 2302, operation switches 2303, a microphone, and the like, and can be opened and closed by a hinge. A pixel portion of the display panel 2302 is placed so that it can be seen through a window formed in a chassis 2301. The display panel 701 of this example can be used for the display panel 2302. According to one of examples of the present invention, the cellular phone with reduced production cost can be realized.

FIG. 5C illustrates a laptop personal computer which includes a main body 2401, a chassis, a display portion 2402, a keyboard, an external connection port, a pointing device, and the like. According to one of examples of the present invention, a laptop personal computer can be manufactured with reduced manufacturing cost.

FIG. 5D illustrates a desk lamp which includes a lighting portion 2501, a shade 2502, an adjustable arm 2503, a support 2504, a base 2505, and a power supply switch 2506. The desk lamp is manufactured by using a light-emitting device formed according to the manufacturing method of one of examples of the present invention for the lighting portion 2501. Note that the term 'lighting appliance' also encompasses ceiling lights, wall lights, and the like. According to any of examples of the present invention, manufacturing cost can be significantly reduced, and an inexpensive desk lamp can be provided.

This example can be combined with Embodiment 1 or Embodiment 2.

This application is based on Japanese Patent Application serial no. 2008-141521 filed with Japan Patent Office on May 29, 2008, the entire contents of which are hereby incorporated by reference.

What is claimed is:

1. A method for manufacturing a light-emitting device, comprising the steps of:
   forming a light absorption layer on one surface of a first substrate;
   selectively forming a first partition over the light absorption layer;
   discharging a material liquid from a nozzle and forming a material layer in contact with the first partition and the light absorption layer;
   providing a second substrate having a first electrode and a second partition on one surface thereof so as to face the one surface of the second substrate and the one surface of the first substrate provided with the material layer;
   irradiating the light absorption layer with light from the other surface side of the first substrate and selectively heating at least a portion of the material layer overlapped with the light absorption layer, thereby forming a layer including an organic compound over the first electrode provided on the one surface of the second substrate; and
   forming a second electrode over the layer including the organic compound.

2. The method according to claim 1, wherein the light is emitted in a state that portions of the first partition and the second partition are in contact with each other.

3. The method according to claim 1, wherein the material liquids discharged on the first substrate from their respective nozzles reach the surface of the first substrate continuously from tips of the nozzles.

4. The method according to claim 1, wherein the step of discharging the material liquid from the nozzle is performed by pump feeding.

5. The method according to claim 1, wherein the light absorption layer is arranged in a stripe manner.

6. The method according to claim 1, wherein the material layer is a stripe-shape.

7. The method according to claim 1, wherein a light source for the step of irradiating the light absorption layer with the light is a lamp light or a laser light.

8. A method for manufacturing a light-emitting device, comprising the steps of:
   forming a light absorption layer on one surface of a first substrate;
   selectively forming a first partition over the light absorption layer;
   discharging plural kinds of material liquids from a plurality of respective nozzles and forming a plurality of material layers including the material liquids in contact with the first partition and the light absorption layer;
   providing a second substrate having a plurality of first electrodes and a second partition on one surface thereof so as to face the one surface of the second substrate and the one surface of the first substrate provided with the plurality of material layers;
   irradiating the light absorption layer with light from the other surface side of the first substrate and selectively heating at least a portion of each of the material layers overlapped with the light absorption layer, thereby forming a plurality of layers each including an organic compound over the plurality of first electrodes provided on the one surface of the second substrate; and
   forming a second electrode over the plurality of layers each including the organic compound,
   wherein the second partition is provided between the plurality of first electrodes on the one surface of the second substrate.

9. The method according to claim 8, wherein the light is emitted in a state that portions of the first partition and the second partition are in contact with each other.

10. The method according to claim 8, wherein the material liquids discharged on the first substrate from their respective nozzles reach the surface of the first substrate continuously from tips of the nozzles.

11. The method according to claim 8, wherein the step of discharging the material liquids from the nozzles is performed by pump feeding.

12. The method according to claim 8, wherein the light absorption layer is arranged in a stripe manner.

13. The method according to claim 8, wherein each of the plurality of material layers is a stripe-shape.

14. The method according to claim 8, wherein a light source for the step of irradiating the light absorption layer with the light is a lamp light or a laser light.

* * * * *